United States Patent
Wu et al.

(10) Patent No.: US 6,440,797 B1
(45) Date of Patent: Aug. 27, 2002

(54) NITRIDE BARRIER LAYER FOR PROTECTION OF ONO STRUCTURE FROM TOP OXIDE LOSS IN A FABRICATION OF SONOS FLASH MEMORY

(75) Inventors: Yider Wu, Campell; Jean Yee-Mei Yang, Sunnyvale; Mark Ramsbey, Sunnyvale; Emmanuel H. Lingunis, San Jose; Yu Sun, Saratoga, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/966,702

(22) Filed: Sep. 28, 2001

(51) Int. Cl.7 ................. H01L 21/8247; H01L 21/00
(52) U.S. Cl. ............... 438/261; 438/954; 438/558
(58) Field of Search ................. 438/257, 267, 438/954, 558

(56) References Cited

U.S. PATENT DOCUMENTS

| | | | |
|---|---|---|---|
| 5,418,175 A | * 5/1995 | Hsue et al. | |
| 5,656,837 A | 8/1997 | Lancaster et al. | 257/314 |
| 5,985,718 A | * 11/1999 | Dalla Libera et al. | 438/264 |
| 6,117,730 A | 9/2000 | Komori et al. | 438/258 |
| 6,133,095 A | * 10/2000 | Eitan et al. | 438/261 |
| 6,159,829 A | 12/2000 | Warren et al. | 438/530 |
| 6,172,907 B1 | 1/2001 | Jenne | 365/185.18 |
| 6,177,318 B1 | 1/2001 | Ogura et al. | 438/267 |
| 6,218,227 B1 | 4/2001 | Park et al. | 438/216 |
| 6,242,305 B1 | 6/2001 | Foote et al. | 438/262 |
| 6,248,633 B1 | 6/2001 | Ogura et al. | 438/267 |
| 6,248,635 B1 | 6/2001 | Foote et al. | 438/287 |
| 6,252,276 B1 | 6/2001 | Ramsbey et al. | 257/321 |
| 6,319,775 B1 | * 11/2001 | Halliyal et al. | 438/261 |
| 6,348,381 B1 | * 2/2002 | Jong et al. | 438/261 |
| 6,362,052 B1 | * 3/2002 | Rangarajan et al. | 438/262 |

* cited by examiner

Primary Examiner—Richard Booth
(74) Attorney, Agent, or Firm—Renner, Otto, Boisselle & Sklar, LLP

(57) ABSTRACT

A method for fabricating a SONOS device having a buried bit-line including the steps of: providing a semiconductor substrate having an ONO structure overlying the semiconductor substrate; forming a nitride barrier layer on the ONO structure to form a four-layer stack; forming a patterned photoresist layer on the nitride barrier layer; implanting As or P ions through the four-layer stack to form a bit-line buried under the ONO structure; stripping the photoresist layer and cleaning an upper surface of the four-layer stack; and consolidating the four-layer stack by applying an oxidation cycle. The invention further relates to a SONOS-type device including the nitride barrier layer.

20 Claims, 4 Drawing Sheets

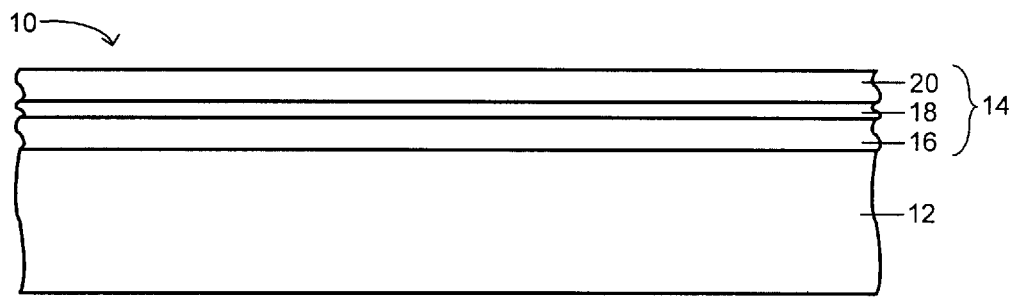
Fig. 1A - PRIOR ART
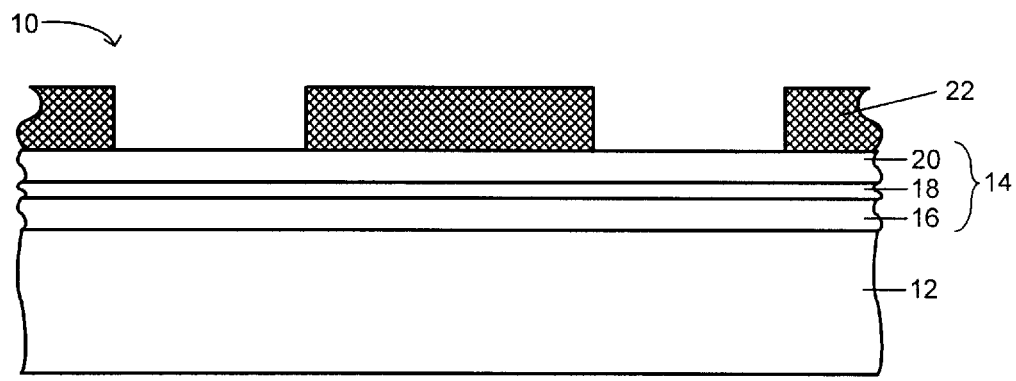
Fig. 1B - PRIOR ART
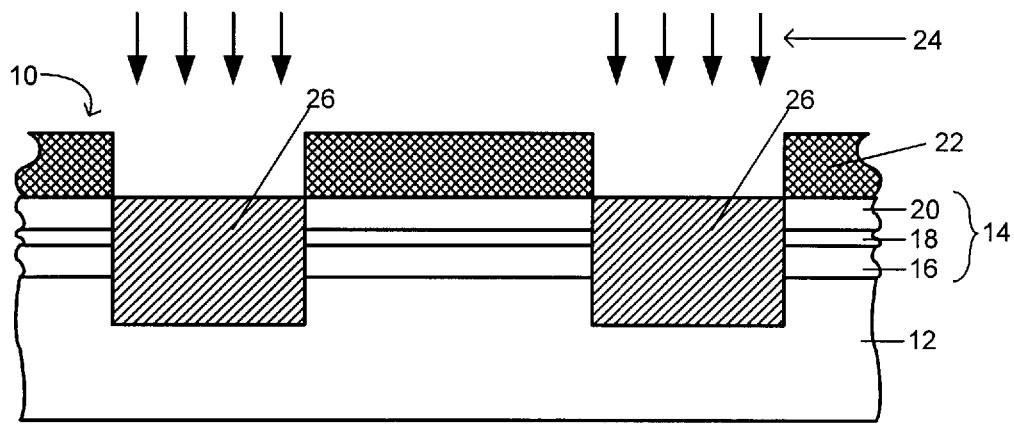
Fig. 1C - PRIOR ART
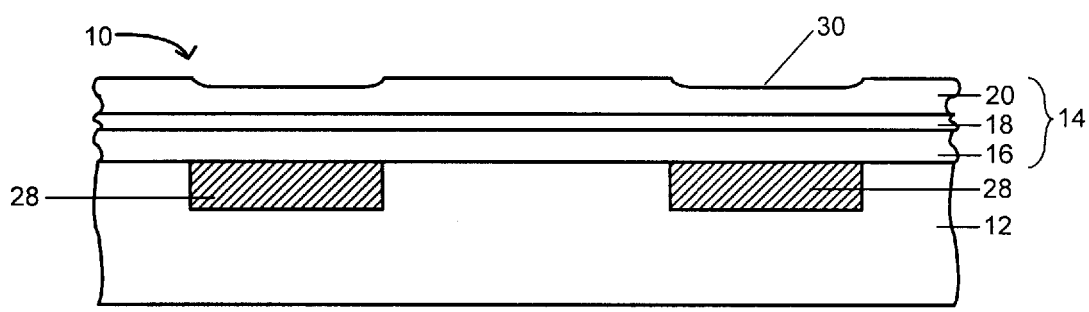
Fig. 1D - PRIOR ART

NITRIDE BARRIER LAYER FOR PROTECTION OF ONO STRUCTURE FROM TOP OXIDE LOSS IN A FABRICATION OF SONOS FLASH MEMORY

FIELD OF THE INVENTION

The invention relates generally to the fabrication of semiconductor devices and, more particularly, to the fabrication of the dielectric layers in semiconductor devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A flash device that utilizes the ONO structure is a Silicon-Oxide-Nitride-Oxide-Silicon (SONOS) type cell, such as the Mirror-Bit™ SONOS-type flash memory device available from Advanced Micro Devices, Sunnyvale, California. The SONOS type cell includes a bit-line, a word line and an ONO structure which function together to determine the location of the bit stored in memory. Important factors towards achieving high performance of the SONOS type cell include the quality and cleanliness of the ONO structure.

A problem exists with known SONOS fabrication techniques in that the quality and cleanliness of the ONO structure cannot be guaranteed during the fabrication process of the transistor. One reason that these factors cannot be guaranteed is that during production of the SONOS type cell, the top oxide layer of the ONO structure is subjected to repeated photoresist application and removal. For example, a resist layer is formed on the ONO structure to protect the device during arsenic implant that forms the underlying bit-line. After the arsenic is implanted, typically ashing (high temperature anneal or plasma treatment in an oxygen-containing atmosphere) and a wet clean are used to remove the resist layer.

Resist material remaining on the top oxide layer of the ONO structure can adversely affect the connection between the top oxide layer and an overlying polycrystalline silicon layer of the SONOS cell to degrade performance of the memory cell. To effectively remove the resist layer, the top oxide layer should be aggressively cleaned so that no organic residue of the resist material remains to contaminate the top oxide of the ONO structure. According to known SONOS type cell structures, however, if cleaning is accomplished with an aggressive acid, such as hydrofluoric acid, the aggressive acid or treatment can degrade the top oxide layer of the ONO structure.

Referring now to FIGS. 1A–1D, there is shown a conventional method of forming a bit-line by implantation of, e.g., arsenic (As). In FIG. 1A, a portion of a nascent SONOS structure 10 is shown. The nascent SONOS structure 10 includes a semiconductor substrate 12, and an ONO structure 14. The ONO structure 14 includes a bottom silicon oxide layer 16, a silicon nitride layer 18, and a top silicon oxide layer 20.

As shown in FIG. 1B, next, a photoresist layer 22 is applied to the upper surface of the ONO structure 14, and then a bit-line pattern is etched into the photoresist layer 22.

As shown in FIG. 1C, As ions, shown schematically by arrows 24, are implanted into the nascent SONOS structure 10, to form implanted areas 26 in the ONO structure 14 and in the underlying semiconductor substrate 12. The portion of the implanted area 26 which is in the semiconductor substrate 12 will form the bit-line structures in the completed SONOS structure 10.

Following the As ion implantation step, the photoresist layer 22 is stripped, the upper oxide surface of the ONO structure 14 is cleaned, and the ONO structure 14 is consolidated by applying an oxidation cycle.

The stripping, cleaning and oxidation steps include the use of harsh chemicals which may etch the top silicon oxide layer 20. In the portions of the top silicon oxide layer 20 through which As ions have been implanted, the implanted ions increase the susceptibility of the silicon oxide to erosion by such chemicals. As a result of the conventional stripping, oxidation and cleaning steps, a significant portion of the upper silicon oxide layer 20 may be etched away, as shown in FIG. 1D.

FIG. 1D shows a conventional SONOS structure 10 at the point in the fabrication process following As ion implantation to form bit-lines 28, stripping of the photoresist, oxidation and cleaning, in which depressions or pits 30 have been formed in portions of the upper silicon oxide layer 20. The portions of the upper silicon oxide layer 20 including the depressions or pits 30 have a reduced thickness compared to other portions of the upper silicon oxide layer 20. This difference in thickness can have a significant negative impact on the operation and functioning of the memory cell to be formed in the SONOS structure 10.

In sum, while there have been recent advances in EEPROM technology, numerous challenges exist in the fabrication of these devices. In particular, there is a need for an improved method of generating a SONOS type flash cell and EEPROM technology that allows for aggressive cleaning of the top layer of the ONO structure. In addition, a need remains for methods of fabricating a high quality ONO structure after multiple photoresist coating and cleaning cycles without degrading the top silicon oxide layer of the ONO structure.

SUMMARY OF THE INVENTION

The present invention addresses the challenges existing in fabrication of such SONOS type structures. The present invention meets the need for a method of fabricating a high quality ONO structure which can withstand the rigors of the fabrication process without degradation of the top silicon oxide layer of the ONO structure.

The present invention thus relates to a method for fabricating a SONOS device having a buried bit-line including the steps of: providing a semiconductor substrate having an ONO structure overlying the semiconductor substrate; forming a nitride barrier layer on the ONO structure to form a four-layer stack; forming a patterned photoresist layer on the nitride barrier layer; implanting ions through the four-layer stack to form a bit-line buried under the ONO structure; stripping the photoresist layer and cleaning an upper surface of the four-layer stack; and consolidating the four-layer stack by applying an oxidation cycle.

In one embodiment, the invention further relates to a SONOS-type device comprising an ONO structure comprising an top oxide layer having an upper surface; a nitride barrier layer formed on the upper surface, which thereby form a NONO four-layer stack; and a conductive layer formed on the nitride barrier layer. The conductive layer may be one of polysilicon, a silicide, or a metal. In one embodiment, the device has a SNONOS structure.

BRIEF DESCRIPTION OF THE DRAWINGS

FIGS. 1A–1D are schematic cross-sectional views of steps of a conventional method of forming a bit-line under an ONO structure, in the fabrication of a SONOS type structure.

DETAILED DESCRIPTION

Figure 2A:
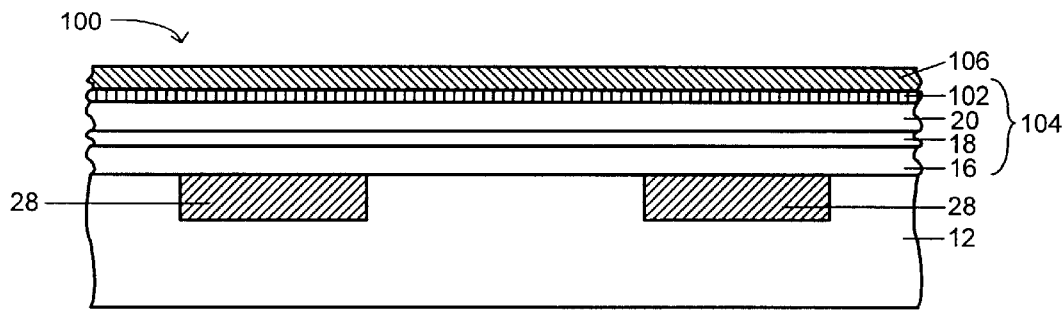
FIGS. 2A–2G are schematic cross-sectional views of steps of a method of forming a bit-line under an ONO structure, in the fabrication of a SONOS type structure, in accordance with an embodiment of the present invention.

The following is a detailed description of the present invention in conjunction with the attached drawings, wherein like reference numerals will refer to like elements throughout. The present invention relates to a method for fabricating a SONOS device in which a nitride barrier layer is applied over an ONO structure prior to implantation of a bit-line forming material, in order to protect the upper layer of the ONO structure from undesired etching or partial removal during subsequent process steps. The nitride barrier layer thus protects the upper surface of the ONO structure, while not interfering with the process steps of forming a bit-line structure by implantation through the ONO structure, and results in formation of an ONO structure having a uniform, substantially flat upper surface.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

Referring now to FIG. 2A, there is shown an embodiment of a nascent SONOS structure 100, following application of the steps of the present invention. The nascent SONOS structure 100 includes a semiconductor substrate 12 and an ONO structure 14 overlying or on the semiconductor substrate 12. The ONO structure 14 includes a bottom silicon oxide layer 16, a silicon nitride layer 18, and a top silicon oxide layer 20. In accordance with the present invention, bit-lines 28 have been implanted under the ONO structure 14. As shown in FIG. 2A, the upper surface of the ONO structure 14, i.e., the upper surface of the silicon oxide layer 20, is substantially flat. The upper surface of the silicon oxide layer 20 includes substantially no indentations or depressions formed as a result of the process of implantation of the bit-lines 28.

The nascent SONOS device 100 shown in FIG. 2A further includes a nitride barrier layer 102. The ONO structure 14 and the nitride barrier layer 102 together form a four-layer stack 104. The four-layer stack 104 thus has a NONO structure.

The nascent SONOS device 100 shown in FIG. 2A further includes a conductive layer 106, formed on an upper surface of the four-layer stack 104. The conductive layer 106 may be formed by any conductive material appropriate for use as a word-line in a device such as a flash EEPROM. For example, the conductive material may be polycrystalline silicon (also referred to as polysilicon, or simply as "poly"), a silicide, or a metal. The present invention is not limited to any particular material for the conductive layer.

The method of the present invention is more fully described in the following, which provides details of the major steps of the method. Numerous additional steps or sub-steps may be utilized to carry out the complete process of fabrication of a SONOS device; for brevity and since a person of skill in the art will understand those steps, they are not repeated in detail.

The present invention relates to a method for fabricating a SONOS device having a buried bit-line including the steps of: providing a semiconductor substrate having an ONO structure overlying the semiconductor substrate; forming a nitride barrier layer on the ONO structure, to form a four-layer stack; forming a patterned photoresist layer on the nitride barrier layer; implanting ions through the four-layer stack to form a bit-line buried under the ONO structure; stripping the photoresist layer and cleaning an upper surface of the four-layer stack; and consolidating the four-layer stack by applying an oxidation cycle. In one embodiment, the method further includes application of a conductive layer over the nitride barrier layer. In one embodiment, the nitride barrier layer is not completely removed in subsequent fabrication steps. In one embodiment, the nitride barrier layer is partially removed as a result of oxidation, and in another embodiment, the nitride barrier layer is substantially not removed. As a result of the method, a SONOS-type device is obtained which includes a NONO four-layer stack. In an embodiment including a conductive layer formed of polysilicon or a silicide over the nitride barrier layer of the NONO four-layer stack, the device comprises a SNONOS structure. Because the charge transport occurs only through the bottom oxide, the nitride barrier layer does not affect the electrical properties of the device, if the thickness of the nitride barrier layer is small compared to the thickness of the ONO stack structure.

In one embodiment, the nitride barrier layer is formed of a material which is substantially not etched by the steps of stripping and cleaning. In one embodiment, the nitride barrier layer is silicon nitride. In another, the nitride barrier layer is silicon oxynitride (SiO$_x$N$_y$, where x+y provide a stoichiometric balance to Si; silicon oxynitride also may be referred to as "SiON"). In another, the nitride barrier layer is a silicon-rich silicon nitride.

In other embodiments, the nitride barrier layer may be one or more of silicon nitride, tantalum nitride, tantalum silicon nitride, titanium nitride, titanium silicon nitride, tungsten nitride, boron nitride, aluminum nitride, zirconium nitride, hafnium nitride, niobium nitride and vanadium nitride, mixtures of these, and other known nitrides.

In one embodiment, the nitride barrier layer is less than about 100 Å thick. In another embodiment, the nitride barrier layer has a thickness in the range from about 30 Å to about 100 Å in thickness, or from about 50 Å to about 90 Å, or from about 60 Å to about 90 Å, or from about 70 Å to about 80 Å, or from about 95 Å to about 99 Å. In this and in all numerical values in the specification and claims, the limits of the ranges and ratios may be combined.

The thickness of the nitride barrier layer should be adequate to provide protection against erosion of the upper surface of the ONO structure, while not interfering with other steps in the process of bit-line formation. In one embodiment, the nitride barrier layer has a thickness which does not prevent implantation of the ions, and in one, the thickness does not substantially reduce the amount of implantation of the ions.

In one embodiment, ions of at least one of arsenic (As), phosphorus (P) and antimony (Sb) are implanted in the implanting step, as a result of which a bit-line structure is formed in locations determined by the photoresist pattern in the silicon substrate underlying the ONO structure. In one embodiment, As is implanted in this step.

As a result of the method of the present invention, in one embodiment, as a result of the presence of the nitride barrier layer, the ONO structure has a substantially flat top oxide surface. The ONO structure having a substantially flat top oxide surface provides the device containing this structure, e.g., a flash EEPROM device, with uniform memory transistors, which insures that the device operates substantially free of variation between memory cells, i.e., substantially uniformly.

Figure 3:
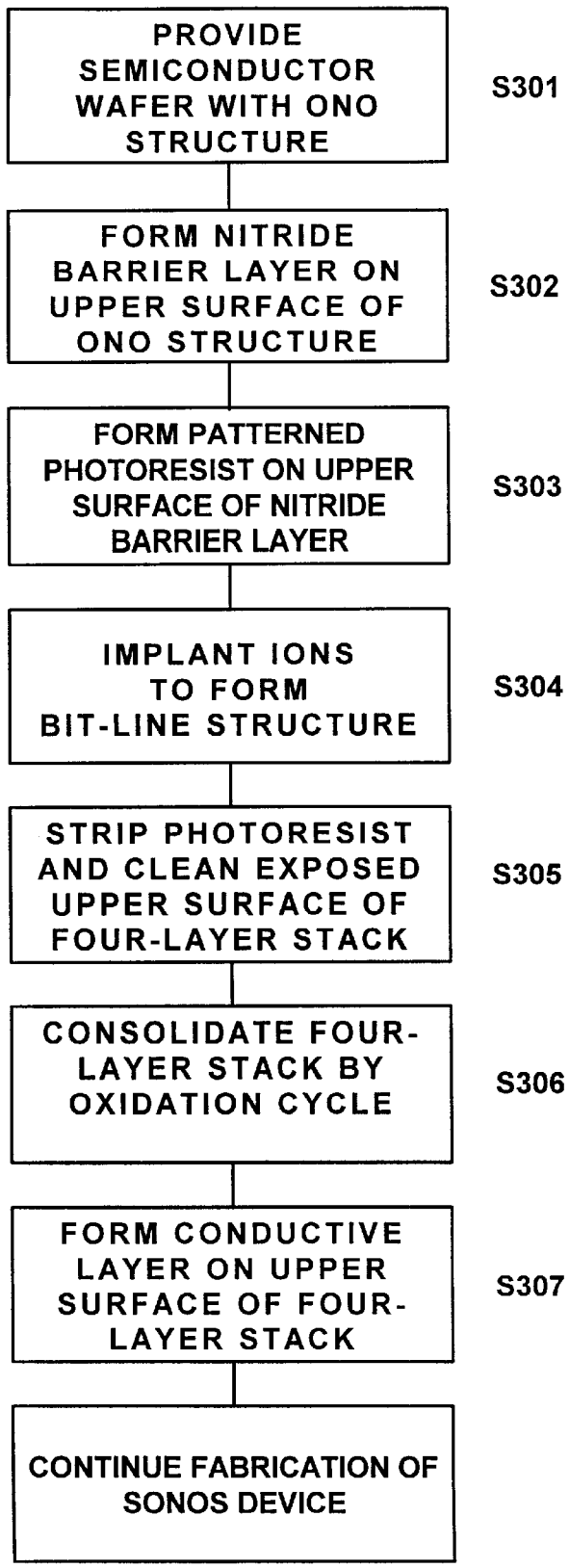
FIG. 3 is a schematic block diagram of a summary of the steps of one embodiment of the method of the present invention, in sequence.

In the first step of the method, shown schematically in FIG. 3 as step S301, a semiconductor device including an ONO structure overlying the semiconductor layer, e.g., on its surface, is provided.

Figure 2B:
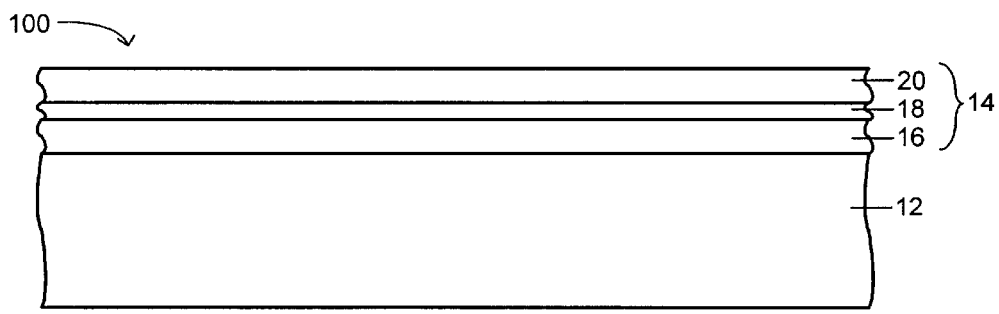

Referring to FIG. 2B, there is shown a portion of a nascent SONOS structure 100 which is essentially identical to the nascent SONOS structure 10 shown in FIG. 1A. The nascent SONOS structure 100, at the point in its fabrication shown in FIG. 2B, includes the semiconductor substrate 12 and the ONO structure 14. The ONO structure 14 includes the bottom silicon oxide layer 16, the silicon nitride layer 18, and the top silicon oxide layer 20. The nascent SONOS structure 100 of FIG. 2B may be provided by methods known to those of skill in the art.

In the second step of the method, shown schematically in FIG. 3 as step S302, a nitride barrier layer is formed on the upper surface of the top oxide layer of the ONO structure.

Figure 2C:
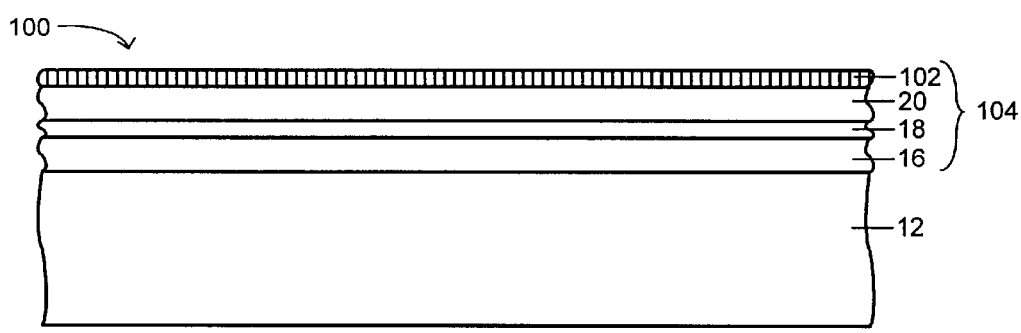

Referring now to FIG. 2C, a nitride barrier layer 102 has been applied to the upper surface of the silicon oxide layer 20, to form a four-layer stack 104. The four-layer stack 104 includes the nitride barrier layer 102 and the ONO structure 14. The nitride barrier layer 102 may be any of the above-described materials.

The nitride barrier layer 102 may be applied by methods known to those of skill in the art. Such methods include, but are not limited to, PECVD, LPCVD and RTCVD. The present invention is not limited to any particular method of forming the nitride barrier layer. In one embodiment, the nitride barrier layer 102 is applied over the entire surface of the semiconductor wafer upon which the nascent SONOS structure 100 is being formed.

As noted above, the nitride barrier layer 102 need only be about 100 Å or less in thickness. The thickness of the nitride barrier layer 102 is only that which is adequate to protect the upper surface of the silicon oxide layer 20 from etching or removal by chemicals used in the masking, implantation and mask removal steps, and any other cleaning steps, such as cleaning by the RCA (Kern and Puotinen) method. The thickness of the nitride barrier layer 102 is not so thick as to inhibit or prevent implantation of the materials for forming the bit-line 28.

In the third step of the method, shown schematically in FIG. 3 as step S303, a patterned photoresist layer is formed over the nitride barrier layer. The photoresist layer is formed first, after which a pattern is formed therein by lithography, by any lithographic method known in the art. The present invention is not limited to any particular photoresist material or lithographic method of forming a pattern therein.

Figure 2D:
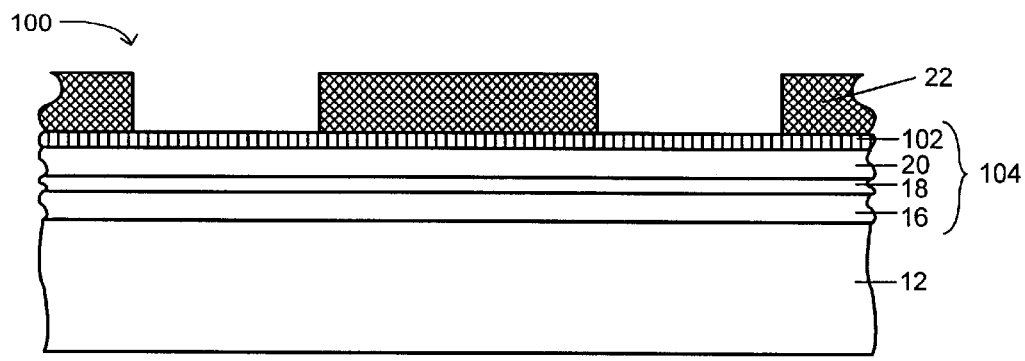

Referring now to FIG. 2D, there is shown the nascent SONOS structure 100 following application and patterning of a photoresist layer 22. The photoresist layer 22 is applied substantially to the entire upper surface of the four layer stack 104, i.e., on the nitride barrier layer 102. The photoresist layer 22 may be formed of any appropriate material known in the art. The present invention is not limited to any particular photoresist material. The photoresist material should be one which resists the passage of the implantation ions, e.g., As, P or Sb, through the photoresist material into the underlying semiconductor layer 12. Following application of the photoresist layer 22, a bit-line pattern is etched into the photoresist layer 22. The bit-line pattern corresponds to the locations at which the bit-lines 28 will be placed by the implantation step.

In the fourth step of the method, shown schematically in FIG. 3 as step S304, ions are implanted into the nascent SONOS structure 100 to form a bit-line structure in a pattern corresponding to the patterned photoresist layer.

Figure 2E:
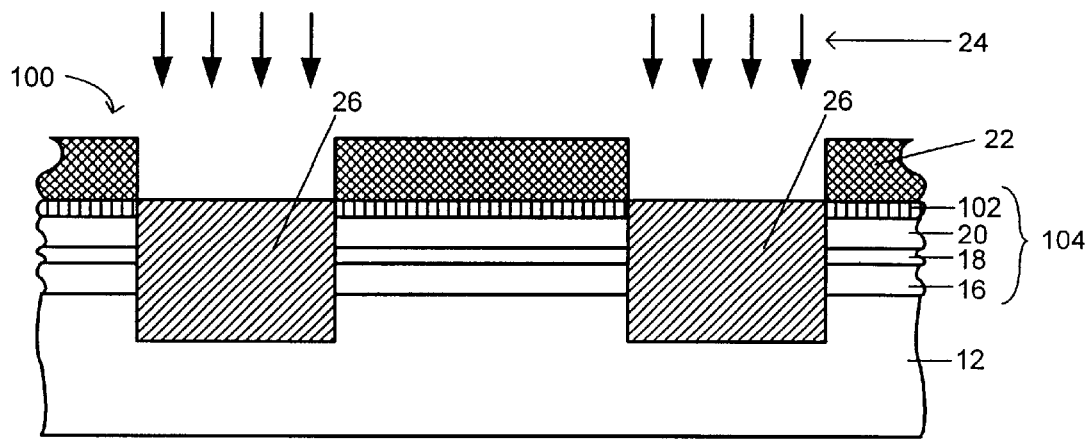

As shown in FIG. 2E, ions, shown schematically by arrows 24, are implanted into the nascent SONOS structure 100. The implanted ions form an implanted area 26 in the ONO structure 14 and in the underlying semiconductor substrate 12. The portion of the implanted area 26 which is in the semiconductor substrate 12 will form the bit-line structures in the completed SONOS structure 100. As noted above, the ions which are implanted to form the bit-lines may be one or more of As, P and Sb. In one embodiment, the implanted ions are As.

In one embodiment, the ions are As ions implanted at an energy in the range from about 5 to about 100 KeV, and at a dosage in the range from about 1E15/cm$^2$ to about 1E18/cm$^2$. In another embodiment, the ions are P ions implanted at an energy in the range from about 3 to about 70 KeV, and at a dosage in the range from about 1E15/cm$^2$ to about 1E18cm$^2$. In another embodiment, the ions are Sb ions implanted at an energy in the range from about 5 to about 140 KeV, and at a dosage in the range from about 1E15/cm$^2$ to about 1E18/cm$^2$. These energies and dosages are exemplary, and may be adjusted as necessary, based on parameters known to those of skill in the art. For example, as dimensions are further reduced, either or both of the energies and the dosages may be reduced, and conversely, for thicker sacrificial barrier and ONO layers, the energies and/or dosages may be increased.

The ions are implanted at an energy sufficient that most of the ions pass through the four layer stack 104 and into the underlying semiconductor substrate 12. However, some of the ions remain in the layers of the four layer stack 104 as indicated schematically by the area 26 in FIG. 2E. Subsequent processing steps substantially return the layers to their pre-implantation structure and composition. Very little of the implanted ions remain in the ONO or NONO stack. Any damage to the ONO stack is expected to be repaired by the subsequent oxidation process. The ONO repair helps to maintain device quality.

In one embodiment, arsenic is implanted at a low angle, for example from 0° to about 7° from a direction normal to the surface of the four-layer stack 104. Implanting As at such an angle results in the formation of a bit-line substantially in alignment with the etch pattern in the photoresist layer 22.

In one embodiment, not shown, Boron (B) may also be implanted. Implantation of B in such structures is known in the art. In one embodiment, the B is implanted at a high angle, such as from about 25° to about 35°, in order to form B implant structures which are laterally disposed on the bit-lines with respect to the As implanted portion of the bit-lines. Such structures are shown and described in commonly assigned U.S. Pat. No. 6,242,305, which is incorporated by reference herein for its teachings relating to implantation.

In the fifth step of the method, shown schematically in FIG. 3 as step S305, the photoresist layer is stripped and the upper surface of the four-layer stack is cleaned. The cleaning may include application of harsh chemicals such as hydrogen fluoride (HF).

Figure 2F:
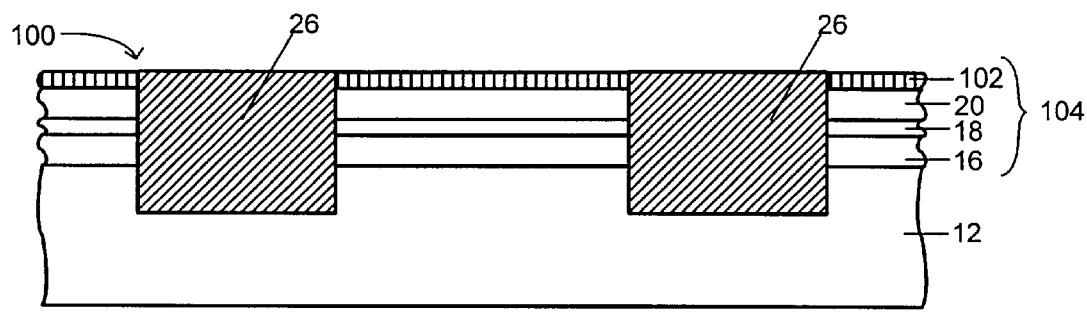

As shown in FIG. 2F, the photoresist layer 22 has been stripped, and the surface of the four layer stack 104 has been cleaned in a series of pre-oxidation cleaning steps. For example, in one embodiment an aqueous mixture of one or more of $H_2SO_4$, $NH_4OH$, HCl and $H_2O_2$ may be used. In another embodiment, an aqueous solution of ammonium persulfate may be used. In another, the resist is dry etched in an oxygen plasma. Any method known in the art for stripping the photoresist and cleaning the substrate may be used. The stripping and cleaning steps are conventional for removal of photoresists and cleaning of the underlying substrate, and are known in the art.

The stripping and cleaning steps may include the use of harsh chemicals (such as HF) and conditions (e.g., high temperature) which could result in etching of the top silicon oxide layer 20, if the nitride barrier layer 102 was not present. In the portions of the top silicon oxide layer 20 through which As has been implanted, the implanted ions and implant induced damage increase the susceptibility of the silicon oxide to erosion by such chemicals. As a result, in conventional stripping, oxidation and cleaning steps, a significant portion of the upper silicon oxide layer 20 may be etched away, as discussed above with respect to FIG. 1D. By use of the present invention, specifically forming the nitride barrier layer 102, these undesirable effects of the implantation are avoided.

The stripping and cleaning step is followed by consolidation of the four-layer stack in an oxidative annealing step referred to as a consolidating step, shown in FIG. 3 as step S306. In one embodiment, the consolidating step is conducted at a temperature in the range from about 600° C. to about 1100° C., or from about 700° C. to about 950° C. The consolidating step may be carried out in an oxygen-containing atmosphere. In one embodiment, the oxygen-containing atmosphere is air. In another embodiment, the oxygen-containing atmosphere is a mixture of gases containing oxygen. In another embodiment, the atmosphere is nitrogen, or hydrogen, and in another both nitrogen and hydrogen may be present. A mixture of any of these gases, or others, may be used. The thermal anneal process may also densify, and therefore, stabilize, the ONO structure 14, and may drive implanted ions from the ONO structure 14 into the implanted portion 26 of the semiconductor substrate 12. The thermal anneal may also act to activate the implanted ions. The consolidation process may be any such oxidative annealing process known in the art.

Figure 2G:
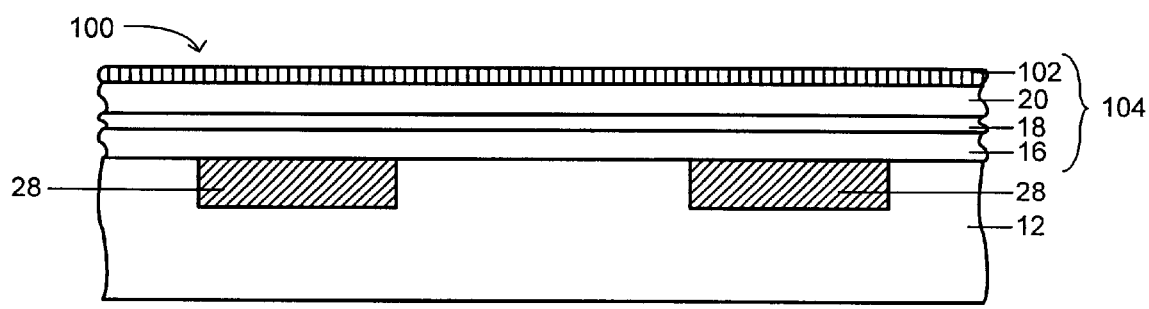

Following the consolidating step, the structure shown in FIG. 2G is obtained. As noted below, in one embodiment, the nitride barrier layer 102 remains as nitride. In another embodiment, the nitride barrier layer is partially or fully oxidized during the consolidation step.

Having formed the barrier layer prior to the implantation provides protection to the upper surface of the ONO structure 14 during the steps following implantation, i.e., during the stripping, cleaning and consolidating steps. The barrier layer should be selected to be a material which, when present at a thickness of less than about 100 Å, will not interfere with the function of the ONO structure. In one embodiment of the invention, when the nitride barrier layer has a dielectric constant greater than silicon dioxide, the function of the ONO structure is enhanced by the presence of the nitride barrier layer. Thus, for example, a nitride barrier layer formed of silicon nitride is suitable, since it has a K value of about 7.5, which is higher than that of silicon dioxide, for which the K value is about 3.9. As a further example, a barrier layer formed of hafnium nitride has a K value of about 12–15, so also is desirable.

It is noted that a portion of the upper surface of the nitride barrier layer 102 may be oxidized during the steps of cleaning and consolidating, and this oxidized material may be removed during these steps. As such, the thickness of the nitride barrier layer 102 remaining at the end of the process may be reduced from its original thickness.

As shown in FIGS. 2A and 2G, the structure obtained from the foregoing steps of the method in accordance with the present invention includes an upper surface of the top silicon oxide layer 20 of the ONO structure 14 which is substantially flat. In one embodiment, the upper surface of the top silicon oxide layer 20 is covered and protected by the nitride barrier layer 102. In one embodiment, as a result of the protective nitride barrier layer 102, the upper surface of the top silicon oxide layer 20 is substantially free of depressions or grooves resulting from top oxide loss in the stripping, cleaning and consolidating steps. The present invention thereby addresses and overcomes the problems of the prior art.

Following the consolidating step, in one embodiment of the method, shown schematically in FIG. 3 as step S307, a conductive layer is formed on the nitride barrier layer 102. Such a conductive layer 106 is shown in FIG. 2A. In one embodiment, the conductive layer 106 will form the word line in, e.g., a flash EEPROM device. The conductive layer 106 may be formed of any material known in the art for use as a word line conductive material. For example, the conductive layer 106 may be formed of polysilicon, a silicide, or a metal. The silicides may include any silicide known to be useful as a word-line, e.g., $MoSi_2$, $TiSi_2$, $TaSi_2$, $WSi_2$, or $CoSi_2$. The metals may include any metal known to be useful as a word-line, e.g., Au, Ag, Al, Mo, W, TiW, TiN, etc. The material of which the conductive layer 106 is formed is not limited to these materials, but may be any known material for such use. The material of which the conductive layer 106 is formed may be applied by any appropriate method known in the art.

For example, in one embodiment, a polycrystalline silicon conductive layer 106 is formed to overlie the nitride barrier layer 102. For example, first the polycrystalline silicon conductive layer 106 is formed by means of RTCVD. The RTCVD process is carried out at a temperature of about 500° C. to about 700° C. and for a period of time sufficient to form polycrystalline silicon having a thickness in the range from about 20 to about 500 Å, or from about 50 to 150 Å. Those skilled in the art will appreciate that other processes can be used to form the polycrystalline silicon conductive layer 106, such as a low-pressure-chemical-vapor-deposition (LPCVD) process. Similarly, those skilled in the art will appreciate that other materials can be used, and other processes can be used to apply the materials, for forming the conductive layer 106.

Following the foregoing steps of the present invention, fabrication of the SONOS structure may be continued and completed by additional steps, such as etching of the conductive layer 106, which will form the word lines of the exemplary memory device.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A method for fabricating a SONOS device having a buried bit-line including the steps of:
    providing a semiconductor substrate having an ONO structure overlying the semiconductor substrate;
    forming a nitride barrier layer on the ONO structure to form a four-layer stack;
    forming a patterned photoresist layer on the nitride barrier layer;
    implanting ions through the four-layer stack to form a bit-line buried under the ONO structure;
    stripping the photoresist layer and cleaning an upper surface of the four layer stack; and
    consolidating the four-layer stack by applying an oxidation cycle.

2. A method as in claim 1, wherein the nitride barrier layer is formed of a material which is substantially not etched by the step of stripping and cleaning.

3. A method as in claim 1, wherein the nitride barrier layer is selected from silicon nitride, tantalum nitride, tantalum silicon nitride, titanium nitride, titanium silicon nitride, tungsten nitride, boron nitride, aluminum nitride, zirconium nitride, hafnium nitride, niobium nitride, vanadium nitride, silicon oxynitride, silicon-rich silicon nitride and mixtures thereof.

4. A method as in claim 3, wherein the nitride barrier layer is silicon nitride.

5. A method as in claim 1, wherein the nitride barrier layer is less than about 100 Å thick.

6. A method as in claim 1, wherein the nitride barrier layer has a thickness which does not prevent implantation of the ions.

7. A method as in claim 1, wherein following the step of consolidating, the ONO structure has a substantially flat top oxide upper surface.

8. A method as in claim 1, wherein following the step of consolidating, the nitride barrier layer is not removed from the four-layer stack prior to subsequent fabrication steps.

9. A method as in claim 1, further comprising a step of applying a conductive layer on the four-layer stack.

10. A method for fabricating a SONOS device having a buried bit-line including the steps of:
    providing a semiconductor substrate having an ONO structure overlying the semiconductor substrate;
    forming a silicon nitride barrier layer on the ONO structure to form a four-layer stack;
    forming a patterned photoresist layer on the nitride barrier layer;
    implanting ions through the four-layer stack to form a bit-line buried under the ONO structure;
    stripping the photoresist layer and cleaning an exposed surface of the four-layer stack; and
    consolidating the four-layer stack by applying an oxidation cycle.

11. A method as in claim 10, wherein the nitride barrier layer is formed of a material which is substantially not etched by the step of stripping and cleaning.

12. A method as in claim 10, wherein the silicon nitride barrier layer is less than about 100 Å thick.

13. A method as in claim 10, wherein the silicon nitride barrier layer has a thickness which does not prevent implantation of the ions.

14. A method as in claim 10, wherein following the step of consolidating, the ONO structure has a substantially flat top oxide upper surface.

15. A method as in claim 10, wherein following the step of consolidating, the silicon nitride barrier layer is not removed from the four-layer stack prior to subsequent fabrication steps.

16. A method as in claim 10, further comprising a step of applying a conductive layer on the four-layer stack.

17. A method for fabricating a SONOS device having a buried bit-line including the steps of:
    providing a semiconductor substrate having an ONO structure overlying the semiconductor substrate;
    forming a nitride barrier layer on the ONO structure to form a four-layer stack;
    forming a patterned photoresist layer on the nitride barrier layer;
    implanting ions through the four-layer stack to form a bit-line buried under the ONO structure;
    stripping the photoresist layer and cleaning an upper surface of the four layer stack; and
    consolidating the four-layer stack by applying an oxidation cycle, wherein implanted ions are driven from the ONO structure into the bit-line.

18. The method of claim 17, wherein the consolidating step comprises an oxidative annealing.

19. The method of claim 1, wherein the consolidating step drives implanted ions from the ONO structure into the bit-line.

20. The method of claim 10, wherein the consolidating step drives implanted ions from the ONO structure into the bit-line.

* * * * *